(12) United States Patent
Parpia et al.

(10) Patent No.: US 7,506,296 B1
(45) Date of Patent: Mar. 17, 2009

(54) PROGRAMMABLE LOGIC DEVICE DESIGN TOOL WITH SUPPORT FOR VARIABLE PREDRIVER POWER SUPPLY LEVELS

(75) Inventors: Zahir Parpia, Toronto (CA); Khai Q. Nguyen, San Jose, CA (US); Xiaobao Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 281 days.

(21) Appl. No.: 11/406,929

(22) Filed: Apr. 18, 2006

(51) Int. Cl.
G06F 17/50 (2006.01)
(52) U.S. Cl. ............................... 716/16; 716/1; 716/17; 716/18
(58) Field of Classification Search .................. 716/16, 716/17, 18, 1
See application file for complete search history.

(56) References Cited

U.S. PATENT DOCUMENTS

| | | | |
|---|---|---|---|
| 5,293,082 A * | 3/1994 | Bathaee | 327/108 |
| 5,367,210 A * | 11/1994 | Lipp | 326/26 |
| 6,163,178 A | 12/2000 | Stark et al. | |
| 6,204,700 B1 | 3/2001 | Seyed | |
| 6,218,858 B1 | 4/2001 | Menon et al. | |
| 6,236,237 B1 | 5/2001 | Wong et al. | |
| 6,566,933 B1 * | 5/2003 | Lye | 327/337 |
| 6,570,415 B2 | 5/2003 | Chen et al. | |
| 6,714,050 B2 | 3/2004 | McClintock et al. | |
| 7,167,038 B2 * | 1/2007 | Maxwell | 327/407 |
| 2005/0280440 A1 | 12/2005 | Fukazawa et al. | |
| 2006/0053242 A1 | 3/2006 | Do | |

OTHER PUBLICATIONS

"M61571FP—2×50W Digital Audio Power Amplifier" Nov. 2003, Renesas, Technical Data, Ver. 0.g, 11 pages.*
"17511A—1.0A 6.8V H-Bridge Motor Driver IC", Mar. 2004, Motorola Inc., Technical Data, Rev. 1.0, 12 pages.*
"NJU8714—Stereo BTL Outputs Switching Driver for Class D Amplifier", May 2004, New Japan Radio Co., Ltd., Technical Data, 6 pages.*
"Stratix II Device System Power Considerations" Application Note No. 355 of Altera Corporation, Jun. 2004, ver. 1.0.
"Power Overview" web pages printed from the internet at altera.com on Jan. 18, 2006 (pp. 1-4).
"Operating Conditions" pp. 5-2 of Stratix II Device Handbook, vol. 1 of Altera Corporation, Dec. 2005.

\* cited by examiner

*Primary Examiner*—Sun J Lin
(74) *Attorney, Agent, or Firm*—Treyz Law Group; G. Victor Treyz

(57) ABSTRACT

A logic design system is provided for designing programmable logic device integrated circuits with minimized predriver power consumption. The logic design system identifies predriver circuits that can operate satisfactorily at reduced predriver power supply levels. One or more reduced predriver power supply levels for powering the predriver circuits are identified by the logic design system. The predriver power supply levels that are identified can be different than a maximum allowable power supply voltage used for powering input-output circuitry on the programmable logic device integrated circuit. There may be multiple blocks of predriver circuitry, each of which is powered using a potentially different predriver power supply voltage. The logic design system uses on-screen options to accept user-supplied settings related to minimizing predriver power consumption.

20 Claims, 13 Drawing Sheets

RECOMMENDED PREDRIVER
POWER SUPPLY VALUES

| BLOCK NUMBER | Vccpd |
|---|---|
| 1 | 2.5 V |
| 2, 3 | 3.3 V |
| 4 | 2.5 V |
| 5, 6 | 1.8 V |
| 7 | 2.5 V |
| 8 | 3.3 V |

FIG. 12

PROGRAMMABLE LOGIC DEVICE DESIGN TOOL WITH SUPPORT FOR VARIABLE PREDRIVER POWER SUPPLY LEVELS

BACKGROUND

This invention relates to programmable logic device integrated circuits, and more particularly, to computer aided design (CAD) tools for designing logic circuits in programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools use information on the hardware capabilities of a programmable logic device to help the designer implement the custom logic circuit in the programmable logic device. When the design process is complete, the CAD tools generate configuration data. The configuration data is loaded into programmable logic devices to configure them to perform the desired custom logic function.

Conventional logic design tools provide logic designers with information on how well a given implementation of a custom logic design is expected to perform. Experienced designers can make adjustments to the design to improve performance. For example, if a designer is informed that a particular implementation of a custom circuit is consuming a large amount of power, the designer may use the logic design tools to make changes to the design that reduce power consumption.

Conventional programmable logic devices use multiple power supply levels. Most circuitry in a programmable logic device integrated circuit is located in the center or core of the device. This circuitry, which is generally referred to as core logic, is powered by a core logic power supply voltage commonly called Vccint. Commonly used values of Vccint are in the vicinity of 1.2 volts. Input-output circuitry surrounds the core logic and is powered using an input-output power supply voltage commonly called Vccio. In programmable logic devices in which the input-output circuitry supports multiple signaling standards, the value of Vccio is generally adjustable. A programmable logic device of this type can operate satisfactorily with a Vccio value of 3.3 volts or a Vccio value of 1.5 volts (as an example).

In some programmable logic device architectures, predriver circuitry is used to supply core logic signals to the input-output circuitry. The predriver circuitry strengthens core logic signals before these signals are driven off chip using the output buffer resources in the input-output circuitry. The power supply voltage used to power the predriver circuitry is sometimes referred to as Vccpd.

In conventional programmable logic devices such as programmable logic devices in the Stratix® II programmable logic device family sold by Altera Corporation of San Jose, Calif., the value of Vccpd is fixed at the maximum permissible Vccio value. While Vccio is permitted to range from 1.2 volts to 3.3 volts to accommodate different signaling standards, a fixed Vccpd value of 3.3 volts must be used. If other values of Vccpd are used, the programmable logic device may not function properly.

Other conventional programmable logic devices such as programmable logic devices in the Cyclone™ family sold by Altera Corporation, have internal power supply lines that permanently short together Vccio and Vccpd, so the value of Vccpd is clamped at Vccio. Different blocks of input-output circuitry on a Cyclone™ device may have different values of Vccio, but Vccpd and Vccio values cannot be varied independently.

The practice of fixing Vccpd at a particular value in conventional programmable logic devices tends to reduce device complexity and simplify the design process. However, substantial amounts of power are consumed by the predriver circuitry. For example, under certain power supply conditions, the predriver circuitry may consume significantly more power than the input-output circuitry.

It would therefore be desirable to provide logic design tools that help logic designers reduce predriver power consumption when designing custom circuits for programmable logic devices.

SUMMARY

A logic design system is provided for designing circuits for programmable logic devices with minimized predriver power consumption noise. The logic design system uses computer-aided design tools to obtain a custom circuit design from a user. The logic design system processes the design to produce an implementation of the custom circuit design in a given programmable logic device integrated circuit architecture. The logic design system produces configuration data files based on the custom circuit design. When the configuration data is loaded into a given programmable logic device, the programmable logic device is configured to implement the custom circuit design.

The logic design system optimizes the way in which the circuit design is implemented in the programmable logic device. During the design process, design constraints for the desired custom circuit design are provided to the computer-aided design tools. A user is also provided with on-screen options or other suitable opportunities to supply user-specified predriver power supply settings. The computer-design tools process the custom circuit design to produce optimum configuration data files. During processing, the computer-aided design tools consider whether lowering the predriver power supply voltage will be acceptable. If permitted by the user-supplied settings and if the design constraints are still satisfied, the computer-aided design tool generates a list of one or more different predriver power supply levels to be used in powering the programmable logic device integrated circuit.

For example, in a programmable logic device that is powered using a core logic power supply voltage of 1.2 volts and an input-output circuit power supply voltage of 3.3 volts, the computer-aided design tool(s) can recommend that a predriver power supply voltage of 2.5 volts be used, provided that the simulated performance of the programmable logic device when powered using the 2.5 volt predriver supply will satisfy design constraints. As another example, the computer-aided design tools may generate a plurality of predriver power supply levels to be used (e.g., 1.8 volts for one predriver circuit, 2.5 volts for another predriver circuit, and 3.3 volts for yet another predriver circuit). The computer-aided design tool(s) compute the expected level of performance variation for each potential predriver power supply level and use this information in ensuring that design constraints are satisfied. The configuration data produced by the computer-aided design tools is used to configure the programmable logic device for operation using the recommended predriver supply levels.

Further features of the invention, its nature and various advantages will be more apparent from the accompanying drawings and the following detailed description of the preferred embodiments.

BRIEF DESCRIPTION OF THE DRAWINGS

FIG. 12 is an illustrative screen that the computer-aided design tools of the present invention may present to a user to convey information on recommended predriver power supply levels in accordance with the present invention.

DETAILED DESCRIPTION

Figure 1:
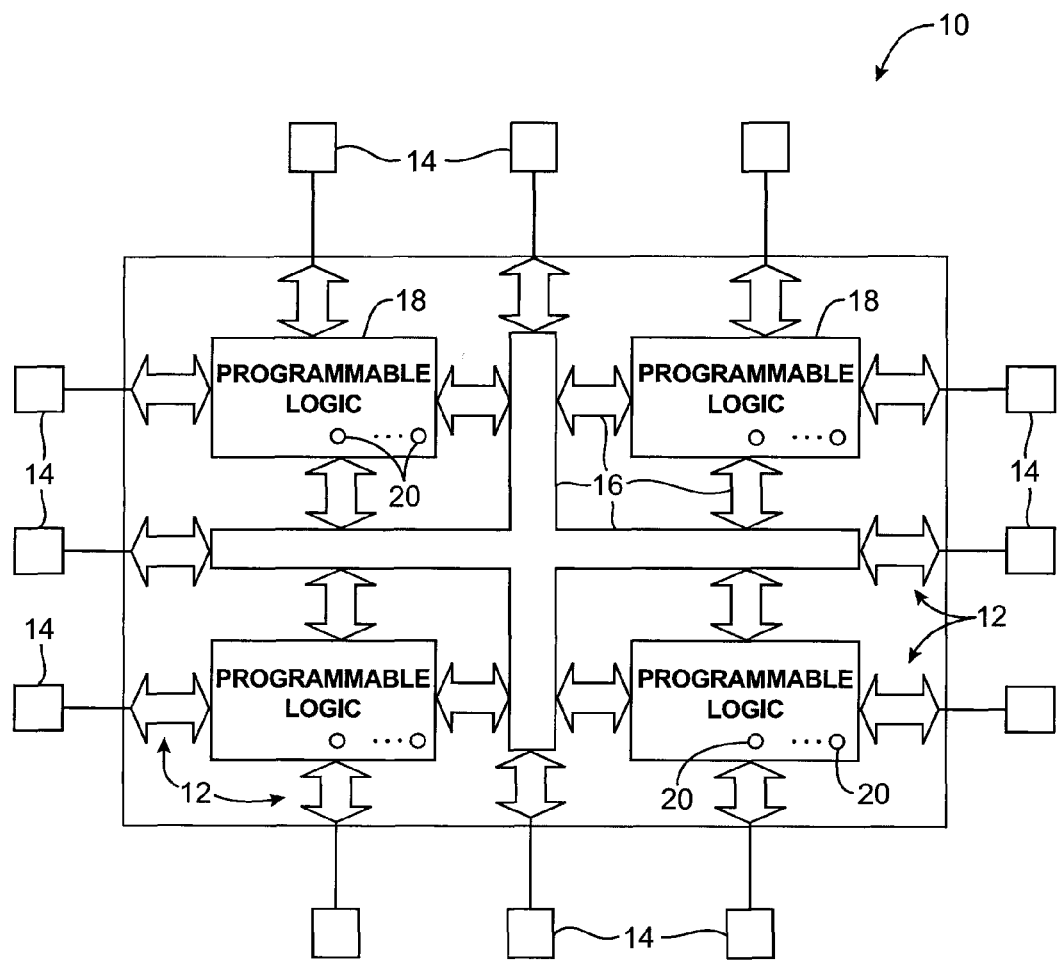
FIG. 1 is a diagram of an illustrative programmable logic device in accordance with the present invention.

The present invention relates to the design of integrated circuits such as programmable logic device integrated circuits. The invention also relates to design tools used to design such circuits and the methods for running these tools.

Programmable logic devices are integrated circuits that can be configured by a user to perform custom logic functions. A programmable logic device is configured ("programmed") by loading configuration data into the device. The configuration data selectively turns on and off components of the device's circuitry and thereby customizes the logic on the device. Programmable logic devices with non-volatile configuration memory retain their configuration data when power is removed. Programmable logic devices with volatile configuration data are typically loaded with configuration data on system power-up using an ancillary circuit called a configuration device. The configuration device may store the configuration data using non-volatile memory. Programmable logic devices with non-volatile memory can also be configured after installation in a system (so-called in-system programming).

The present invention may be used in the context of any integrated circuit that has circuitry that can be configured by a user to perform a custom function, but is described in the context of programmable logic devices as an example.

Programmable logic device integrated circuits in accordance with the present invention have core logic that is powered using a core logic power supply voltage. There is generally a positive core logic power supply voltage called Vccint and a ground voltage Vssint associated with the power supply for the core logic. Programmable logic device integrated circuits in accordance with the present invention also have input-output circuitry that contains input buffers and output buffers. A positive power supply voltage Vccio and a ground power supply voltage Vssio are associated with the input-output circuitry. Predriver circuitry is used to strengthen core logic signals from the core logic that are being provided to the input-output circuitry. The predriver circuitry is powered using a positive power supply voltage Vccpd and a ground power supply voltage Vsspd.

To minimize power consumption by the predriver circuitry while satisfying timing constraints and other design constraints, the predriver power supply voltage Vccpd is allowed to vary. This allows an optimum value of Vccpd to be used when implementing a given circuit design. If desired, different predriver circuits on a given device may be powered using different Vccpd values. Logic design tools in accordance with the present invention take into account the effects of lowered performance due to predriver voltage variations in determining whether a logic designer's desired circuit design can be satisfactorily implemented using one or more lowered values of Vccpd.

In general, the values of the core, predriver, and input-output power supply levels are established through both the positive power supply voltages Vccint, Vccpd, and Vccio and the corresponding ground power supply voltages Vssint, Vsspd, and Vssio. Because Vssint, Vsspd, and Vssio are generally set to a common value (e.g., 0 volts), the invention will sometimes be described in terms of a core power supply level Vccint, a predriver power supply level Vccpd, and an input-output circuitry power supply level Vccio without mention of the corresponding ground value being used.

An illustrative programmable logic device 10 of the type that may be configured to perform the functions of a custom logic circuit designed by a logic design tool in accordance with the present invention is shown in FIG. 1.

Programmable logic device 10 may have input-output circuitry 12 for driving signals off of device 10 and for receiving signals from other devices via input-output pins 14. Input-output circuitry 12 contains input buffers and output buffers (sometimes referred to as input drivers and output drivers). Pins 14 may be any suitable types of pins or solder bumps for making electrical connections between the internal circuitry of device 10 and external packaging. Some of the pins 14 are used for high-speed communications signals. Other pins are used to provide power supply voltages to the device 10. Pins 14 may also be used for DC and low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements 20 in the programmable logic device 10 using pins 14 and input/output circuitry 12. During normal operation of device 10, the programmable elements 20, which are sometimes referred to as configuration bits or configuration memory, each provide a static control output signal that controls the state of an associated logic component in the programmable logic of circuitry 18.

In a typical volatile arrangement, the programmable elements 20 may be random-access memory (RAM) cells that are loaded from an external configuration device integrated circuit via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from electrically-configured fuses or electrically-configured antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, programmable logic devices with programmable elements made from phase-change materials, mask-programmed devices, etc.

The configuration memory of device 10 is preferably provided with configuration data from a user (e.g., a logic designer). Once provided with appropriate configuration data, the configuration memory will selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency.

Figure 2:
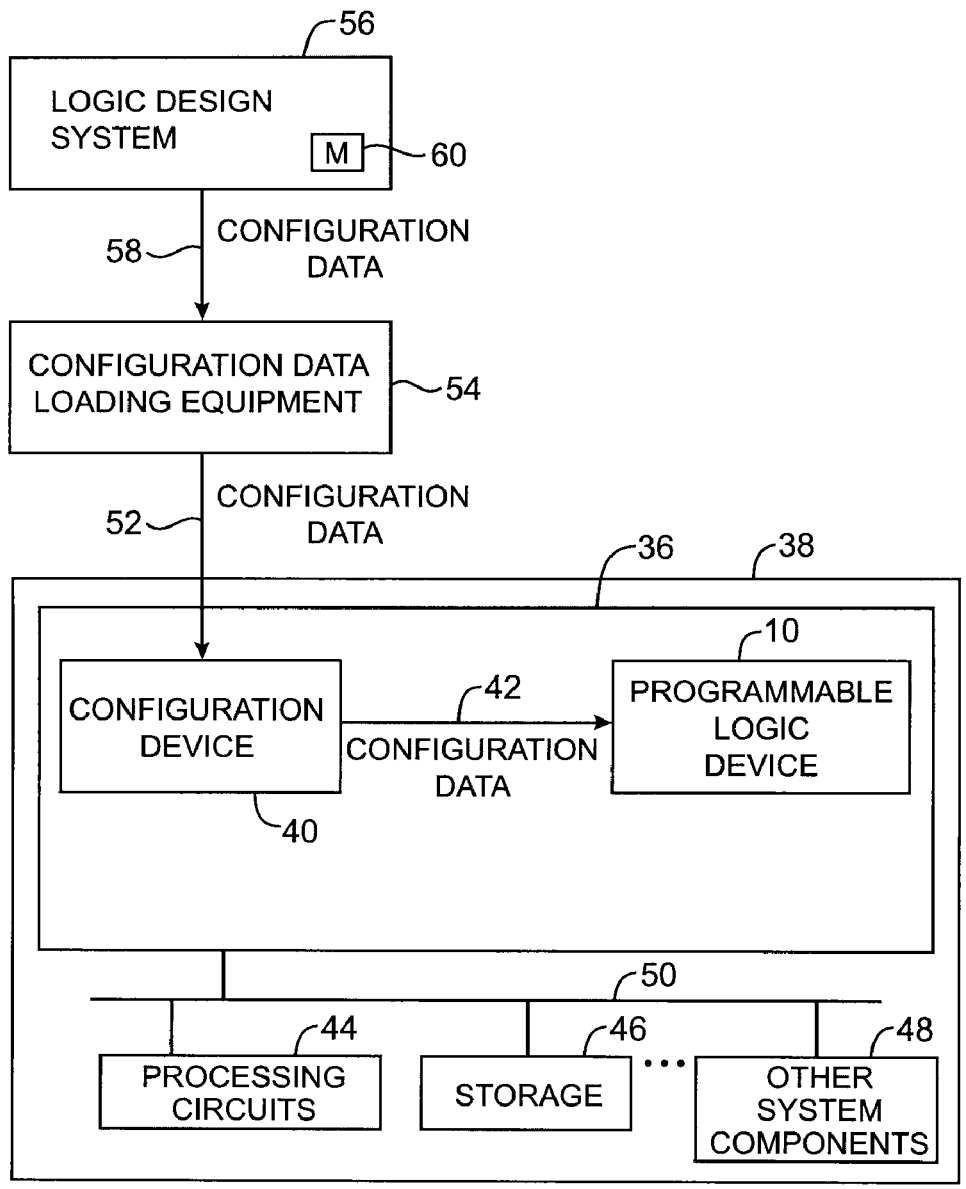
FIG. 2 is a diagram showing how programmable logic device configuration data is created by a logic design system and loaded into a programmable logic device to configure the device for operation in a system in accordance with the present invention.

An illustrative system environment in which a custom logic circuit may be designed and implemented using a programmable logic device is shown in FIG. 2. As shown in FIG. 2, a programmable logic device 10 may be mounted on a board 36 in a system 38. In general, programmable logic device 10 may receive programming data from any suitable equipment or device. In the example of FIG. 2, programmable logic device 10 is the type of programmable logic device that receives configuration data from a configuration device 40. With this type of arrangement, configuration device 40 is mounted on the same board 36 as programmable logic device 10. The configuration device 40 may, for example, include erasable-programmable read-only memory (EPROM) circuitry for storing configuration data and programmable logic device configuration data loading circuitry for loading the data into device 10. When system 38 boots up (or at another suitable time), the configuration data for configuring the programmable logic device may be supplied to programmable logic device 10 from configuration device 40, as shown schematically by path 42. The configuration data that is supplied to the programmable logic device may be stored in the programmable logic device in programmable elements 20.

System 38 may include processing circuits 44, storage 46, and other system components 48. The components of system 38 may be located on one or more boards such as board 36 or other suitable mounting structures or housings and may be interconnected by busses and other electrical paths 50.

Device 40 may be supplied with the configuration data for device 10 over a path such as path 52. Device 40 may, for example, receive the configuration data from configuration data loading equipment 54 or other suitable equipment. Data loading may take place before or after circuitry 40 is installed in system 38.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device or for producing a custom mask for a mask-programmed chip.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42.

In arrangements of the type shown in FIG. 2, the programmable logic device 10 may have configuration data cells formed from memory cells such as static random-access memory cells. This is merely one illustrative arrangement for programming a programmable logic device 10. Any suitable arrangement for programming programmable logic device 10 may be used if desired. For example, programmable logic device 10 may be based on non-volatile configuration data cells such as erasable-programmable read-only memory (EPROM) cells. With this type of arrangement, device 10 can be configured by programming the configuration data into the EPROM cells on the device. Programmable logic device 10 may also be based on programmable elements such as fuses and antifuses or programmable elements based on other technologies (e.g., magnetic devices, mask programming, etc.). In a mask-programmed environment, the configuration data (or other such data) that is produced by the logic design system may be used to generate a mask set for programming device 10. For clarity, the present invention will generally be described in the context of programmable logic devices that are configured by the loading of configuration data produced by logic design system 56, rather than mask programming.

Logic circuit design system 56 includes processing circuitry and storage 60. In supporting design operations involved in implementing a desired custom logic function, the logic design system 56 uses software implemented using circuitry and storage 60 to make circuit resource assignments and placement decisions that minimize predriver power consumption.

Figure 3:
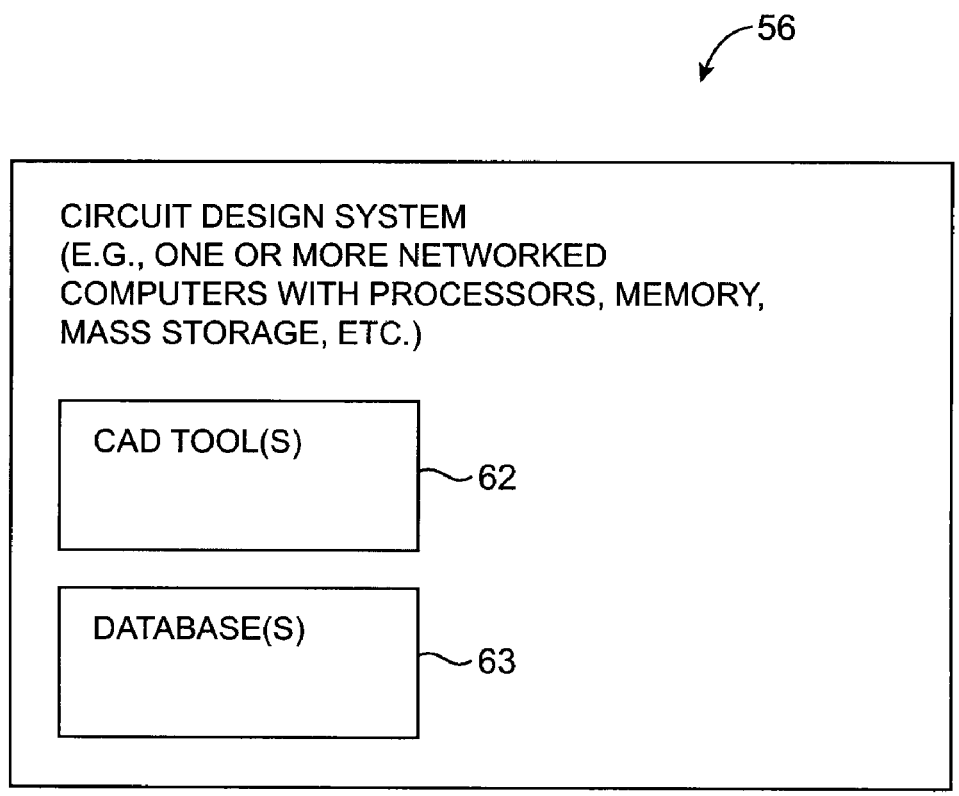
FIG. 3 is a diagram of a circuit design system that may be used to generate configuration data for implementing custom circuit designs in programmable logic devices in accordance with the present invention.

An illustrative circuit design system 56 in accordance with the present invention is shown in FIG. 3. System 56 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 62 and databases 63 reside on system 56. During operation, executable software such as computer aided design tools 62 runs on the processor(s) of system 56. Databases 63 are used to store data for the operation of system 56. In general, software and data may be stored on any computer-readable medium (storage) in system 56. Such storage, which is shown schematically as storage 60 of FIG. 2, may include, computer memory chips, removable and fixed media such as hard disk drives, flash memory, compact discs (CDs), DVDs, other optical media, and floppy diskettes, tapes, or any other suitable memory or storage device(s). When the software of system 56 is installed, the storage 60 of system 56 has instructions and data that cause the computing equipment in system 56 to execute various methods (processes). When performing these processes, the computing equipment is configured to implement the functions of the circuit design system.

The computer aided design (CAD) tools 62, some or all of which are sometimes referred to collectively as a CAD tool, may be provided by a single vendor or multiple vendors. Tools 62 may be provided as one or more suites of tools (e.g., a compiler suite for performing tasks associated with implementing a circuit design in a programmable logic device) and/or as one or more separate software components (tools). Database(s) 63 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

When a logic designer uses tools 62 to implement a circuit, the logic designer is faced with a number of potentially challenging design decisions. The designer must balance factors such as cost, size, and performance to create a workable end product. Tradeoffs are involved. For example, a circuit of a given design can be implemented so that it operates quickly, but consumes a large amount of power and on-chip resources or can be implemented so that is operates more slowly, while consuming less power and fewer resources.

The present invention provides a tool or tools 62 that make resource selections and placement decisions that minimize predriver power consumption while satisfying design constraints such as desired timing margins. For clarity, the predriver power consumption minimization functions of the invention are generally described in the context of logic design system 56 and CAD tools 62. In general, any suitable number of software components (e.g., one or more tools) may be used to provide a circuit designer with predriver power consumption reduction assistance. These software components may be separate from logic compilers, place-and-route tools and other software in tools 62 or some or all of the software components that provide predriver power consumption reduction assistance functionality may be provided within logic synthesis and optimization tools, a place-and-route tool, etc.

Figure 4:
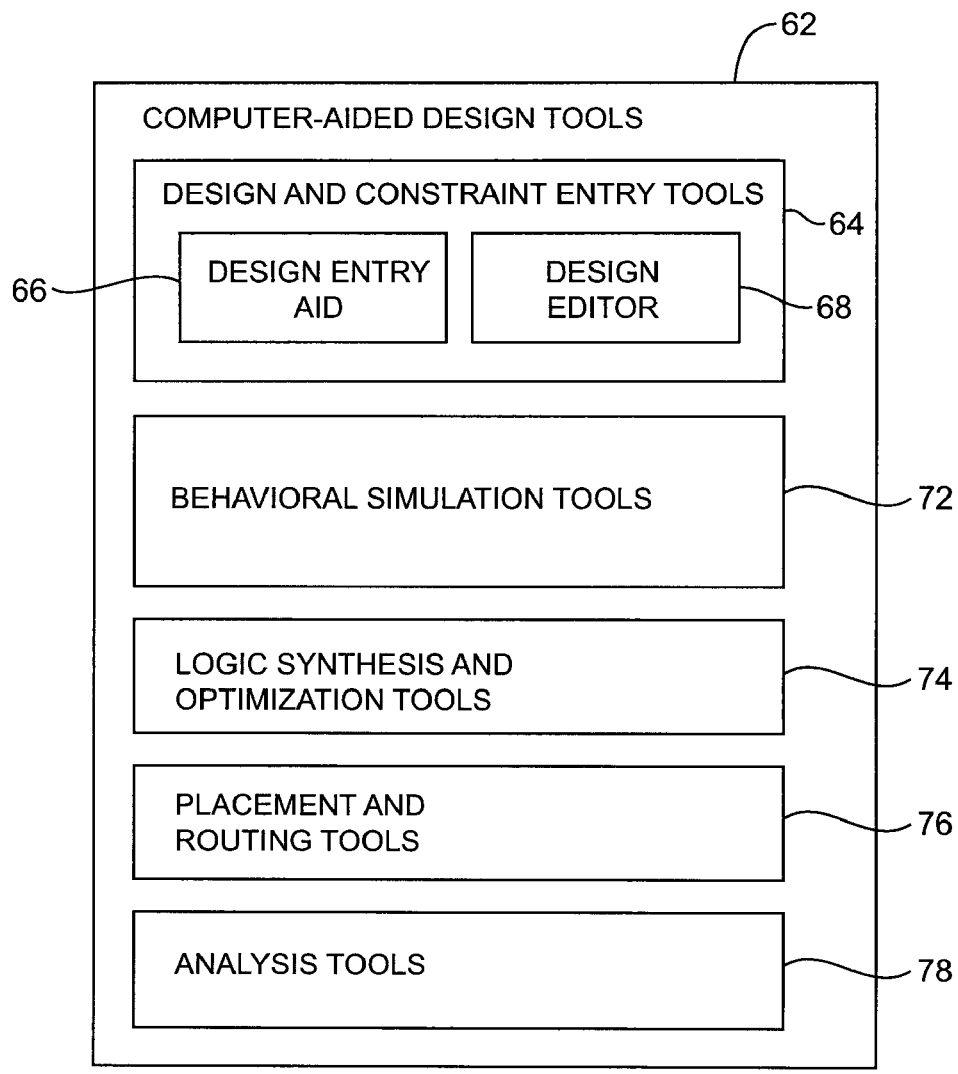
FIG. 4 is a diagram of illustrative computer-aided design (CAD) tools that may be used in a logic design system in accordance with the present invention.

Illustrative computer aided design tools 62 that may be used in a logic design system such as system 56 of FIGS. 2 and 3 are shown in FIG. 4.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 64 may be used to allow a logic designer to provide a desired logic design using any suitable format. For example, design and constraint entry tools 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 64 may allow the logic designer to provide a logic design to the logic design system 10 using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

Tools such as tools 74 and 76 may be part of a compiler suite (e.g., part of a suite of compiler tools provided by a programmable logic device vendor). In accordance with the present invention, tools such as tools 74 and 76 manually and automatically take into account the effects of using different predriver power supply levels in implementing a desired circuit design in a programmable logic device. This allows tools 74 and 76 to minimize predriver power consumption while satisfying design constraints.

After an implementation of the desired logic design in the programmable logic device has been generated using placement and routing tools 76, the implementation of the design may be analyzed and tested using analysis tools 78. After satisfactory optimization operations have been completed using tools 62, tools 62 can produce the configuration data for the programmable logic device or can generate other suitable output data (e.g., the specifications for a lithographic mask set for fabricating an integrated circuit incorporating the logic design). Depending on the type of programmable logic device being used (e.g., a device based on non-volatile memory, a device based on volatile memory, a device based on fuses or antifuses, etc.), configuration data may be programmed into the programmable logic device directly or may be provided to a configuration device that later (e.g., upon power-up) loads the configuration data into the programmable logic device to program the device.

Figure 5:
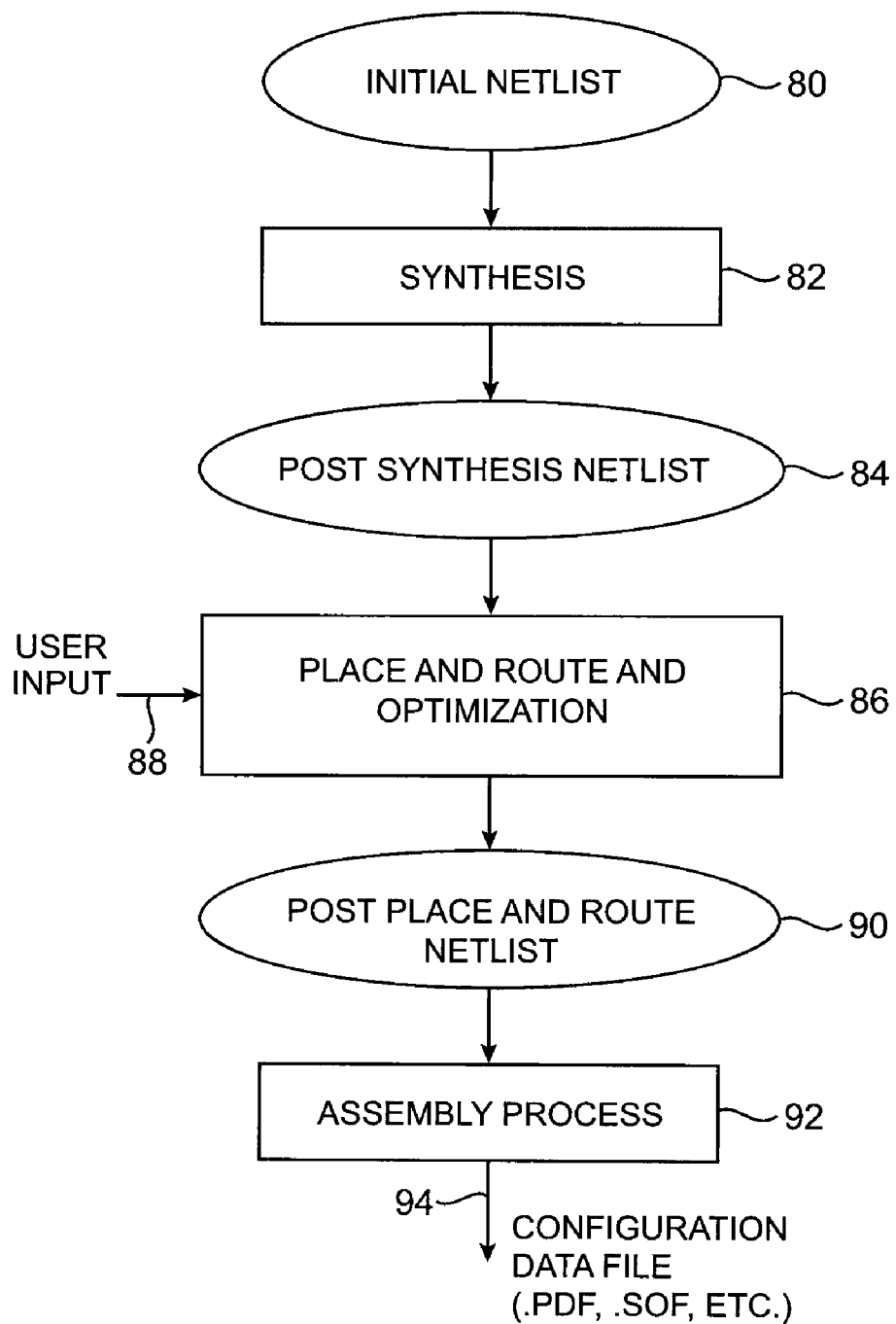
FIG. 5 is a flow chart of illustrative steps involved in designing a custom logic circuit and producing configuration data for that circuit in accordance with the present invention.

Illustrative operations involved in using tools 62 of FIG. 4 to produce configuration data files are shown in FIG. 5. As shown in FIG. 5, an initial netlist 80 is synthesized at step 82 to produce a post-synthesis netlist 84. At step 86, user input 88 and the post synthesis netlist 84 are processed during place and route and optimization operations. During the operations of step 86, the CAD tools 62 take account of the effects of using different predriver power supply levels and, through appropriate selection of predriver power supply levels, circuit resource assignments, and placement decisions, tools 62 reduce predriver power consumption while satisfying design constraints. The resulting netlist 90 is processed further during an assembly process 92 to produce a configuration data file output 94 (e.g., a .pof or .sof file).

CAD tools 62 can automatically identify appropriate predriver power supply levels (e.g., one or more minimum acceptable predriver power supply levels) that allow the logic designer's circuit to function as desired. If desired, manual predriver power supply selections may be supplied by the logic designer.

Figure 6:
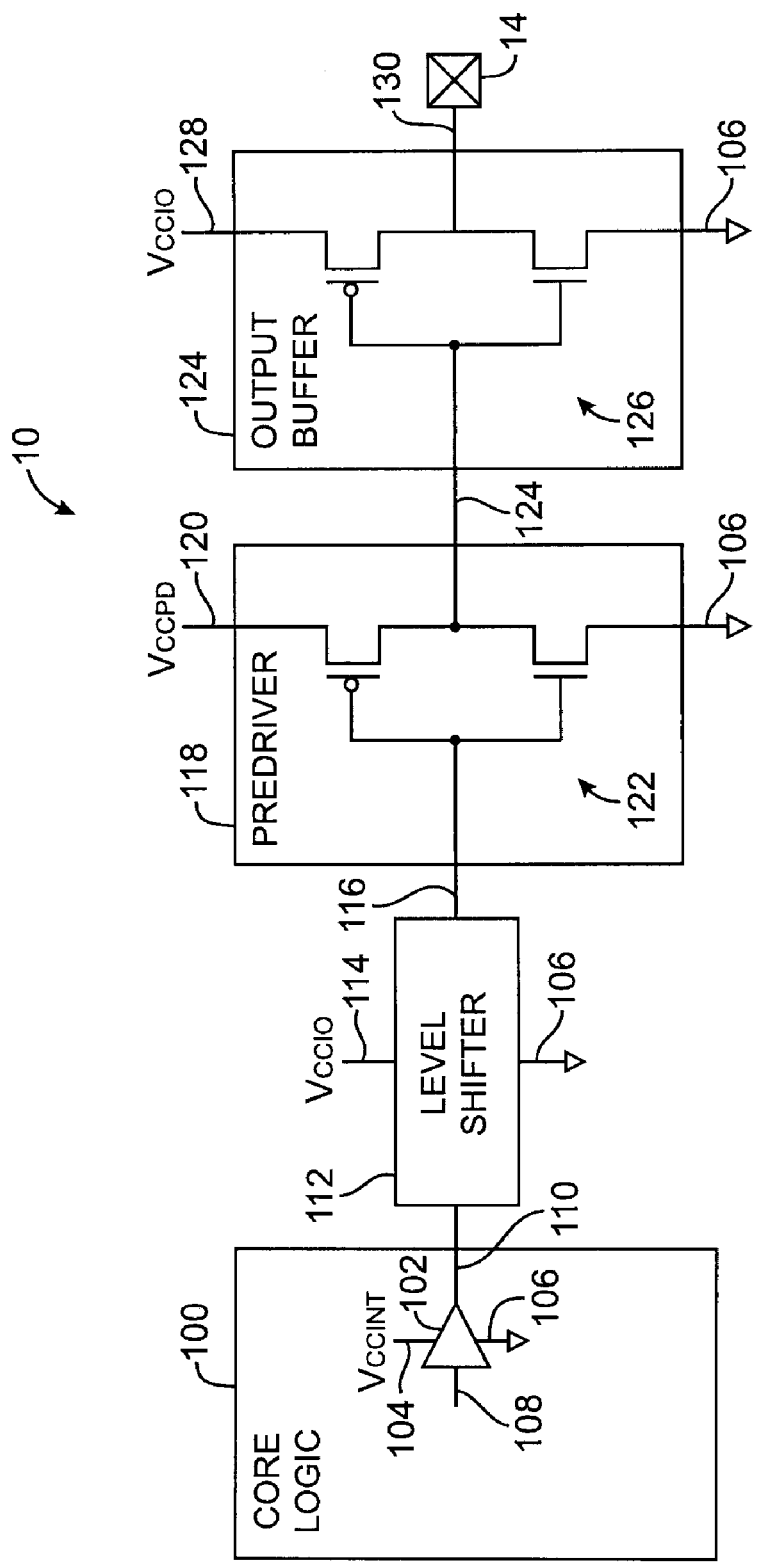
FIG. 6 is a diagram of circuitry on an illustrative programmable logic device integrated circuit containing core logic, predriver circuitry, and input-output circuitry in accordance with the present invention.

An illustrative circuit arrangement of the type that may be used on a programmable logic device integrated circuit 10 in accordance with the present invention is shown in FIG. 6. Core logic 100 contains hardwired circuitry and programmable logic 18 (FIG. 1) that is configured to implement the logic designer's desired circuit design. Core logic 100 receives input data signals and produces output data signals. An illustrative core logic driver 102 is shown in FIG. 6. In a typical programmable logic device 10, there are numerous drivers such as driver 102.

As shown in FIG. 6, driver 102 has power supply terminals 104 and 106. A ground voltage is applied to power supply terminal 106. Ground signals are also applied to the other ground terminals 106 in FIG. 6. A core logic power supply voltage called Vccint is applied to positive power supply terminal 104. Low values of Vccint are desirable, because they help to reduce power consumption on device 10. As semiconductor fabrication techniques advance, it is becoming possible to reduce Vccint to values of 1.2 volts and lower.

For a given programmable logic device 10, the manufacturer specifies an acceptable fixed value of Vccint. In a typical device 10, Vccint is nominally 1.2 volts. Voltage deviations on the order of +/−50 mV from nominal values are permitted for Vccint and other power supply voltages. In the present context, voltages falling within these tolerances are generally considered to be the same. For example, a Vccint voltage of 1.25 and a Vccint voltage of 1.19 are not considered to be different power supply voltage levels, because they both fall within acceptable deviations from the same nominal value of 1.2 volts.

Driver 102 receives core logic signals at input 108 and provides corresponding core logic signals at output 110. The signals on line 110 range from ground to Vccint. To ensure satisfactory processing by circuitry such as predriver circuitry 118, which is generally powered at higher voltage levels, the output signal on line 110 may be level shifted. Level shifter 112 may shift the voltage range of core logic signals on line 110 to any suitable elevated voltage range. With one suitable arrangement, level shifter 112 is powered by an input-output power supply level Vccio received on terminal 114. This allows level shifter 112 to level shift the signal on line 110 to a signal that ranges from ground to Vccio on its output 116.

The level-shifted signal on line 116 is supplied to predriver circuitry 118. Level shifters such as level shifter 112 are sometimes depicted as being separate from predrivers such as predriver 118 and are sometimes considered to be part of predrivers such as predrivers 118. In the example of FIG. 6, level shifter 112 is shown as being separate from predriver 118.

Predriver 118 is powered with a power supply voltage Vccpd. The power supply Vccpd is received at terminal 120. As shown schematically by driver 122, predriver circuitry 118 on device 10 contains drivers that strengthen the input signals received on inputs such as input 116. The strengthened input signals are provided as predriver output signals on lines such as line 124.

The signal on line 124 is received by output buffer 124. Output buffers such as output buffer 124, which form part of the input-output circuitry 12 on programmable logic device 10 contain drivers such as driver circuit 126. Buffer 124 receives a voltage Vccio on terminal 128. The output of driver 126 is supplied to input-output pin 14 using path 130.

The value of Vccint that is used for a given programmable logic device is dictated by the semiconductor manufacturing process that is used to manufacture device 10. With currently available technology, typical values of Vccint are about 1.2 volts. The logic designer cannot change Vccint, because changes to Vccint will cause the device 10 to function improperly.

The value of Vccio is dictated by system-level considerations. For example, if it is desired to use programmable logic device 10 to form a high-speed communications link with an integrated circuit that uses a signaling standard that has 2.5 volt signals, the signals produced by output buffer 124 will need to range from ground to 2.5 volts. As a result, the logic designer will need to use a value of 2.5 volts for Vccio. As another example, if the programmable logic device 10 is being used in a system in which input-output signals are 3.3 volts in magnitude, the logic designer will need to supply a 3.3 volt Vccio signal to terminal 128. Unless the required value of Vccio is used to power the input-output circuitry, the programmable logic device 12 will not interface properly with the remainder of the system. In a typical programmable logic device, permissible values of Vccio are 1.2 volts, 1.5 volts, 1.8 volts, 2.5 volts, and 3.3 volts.

In conventional programmable logic devices, the logic designer is directed to supply a Vccpd value to Vccpd terminal 120 that is equal to the maximum Vccio value (i.e., 3.3 volts). This value is often in excess of what is needed to ensure proper operation of predriver 118. As a result, more power is consumed in the predriver circuitry 118 of conventional programmable logic devices than is necessary.

In accordance with the present invention, the logic design tools 62 analyze the design constraints associated with the logic designer's desired circuit to determine whether Vccpd can be lowered. If lower values are possible while still satisfying the design constraints for the logic designer's desired circuit design, the logic design tool 62 can provide appropriate Vccpd recommendations for the designer. By using these recommendations and the corresponding configuration data produced by the logic design tool 62, predriver power consumption can be reduced.

Figure 7:
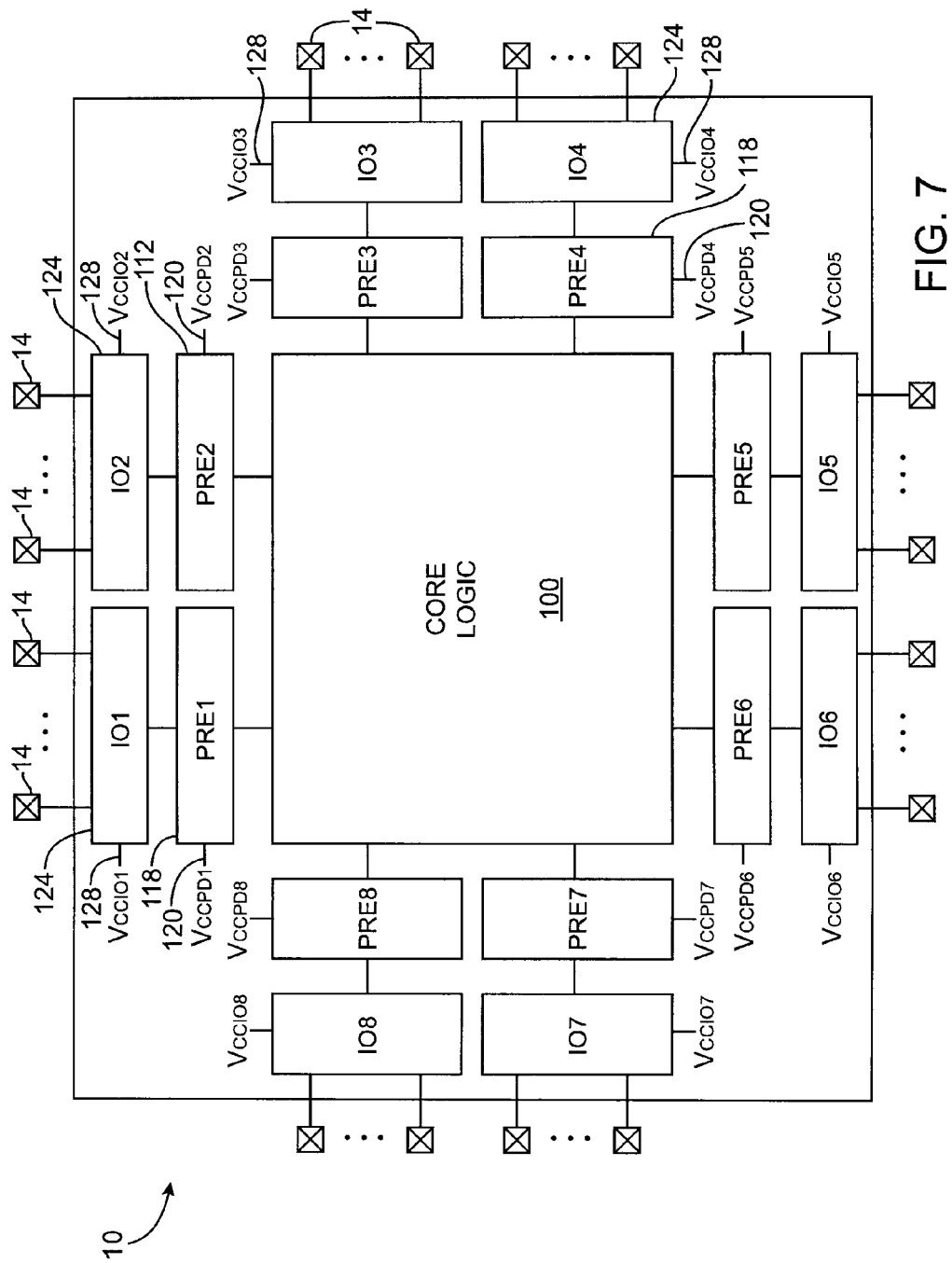
FIG. 7 is a diagram of an illustrative programmable logic device integrated circuit having multiple banks of input-output circuitry and multiple corresponding banks of predriver circuitry powered with potentially different predriver power supply voltages in accordance with the present invention.

If desired, programmable logic device 10 can include multiple blocks of input-output circuitry 124 and corresponding blocks of predriver circuitry 118, as shown in FIG. 7. In the example of FIG. 7, there are eight blocks of input-output circuitry 124, labeled IO1, IO2, ... IO8 and eight corresponding blocks of predriver circuitry 118, labeled PRE1, PRE2, ... PRE8. The input-output circuitry 124 and predriver circuitry 118 is arranged around the periphery of circuit 10, whereas core logic 100 generally occupies the central region of device 10.

As shown in FIG. 7, each input-output circuit block and each predriver circuit receives an associated power supply voltage. For example, input-output circuit block IO1 is powered using a power supply voltage Vccio1, input-output circuit block IO2 is powered using power supply voltage Vccio2, etc. Similarly, predriver block PRE1 is powered using predriver power supply voltage Vccpd1, predriver block PRE2 is powered using predriver power supply voltage Vccpd2, etc. These voltages need not be the same. For example, there may be two or more different values of Vccio. One Vccio value may be used to provide power to blocks IO1, IO2, IO3, and IO4, whereas another Vccio value may be used to provide power to blocks IO5, IO6, IO7, and IO8. Similarly, the predriver voltage supplies may all be the same or two or more of the predriver supplies may be different. For example, one Vccpd value may be used to provide power to predrivers PRE1, PRE2, and PRE3, another Vccpd value may be used to provide power to predrivers PRE4, PRE5, and PRE6, and yet another Vccpd value may be used to provide power to predrivers PRE7 and PRE8. In general, any suitable number of predriver and input-output power supply values may be used, although larger numbers of predriver and input-output power supply values may increase complexity. The predriver power supply voltages that are used to power the predriver blocks may be the same as the permitted values of Vccio (e.g., a set of acceptable fixed values such as 3.3 volts, 2.5 volts, 1.8 volts, 1.5 volts, and 1.2 volts) or other suitable voltages may be used.

Figure 8:
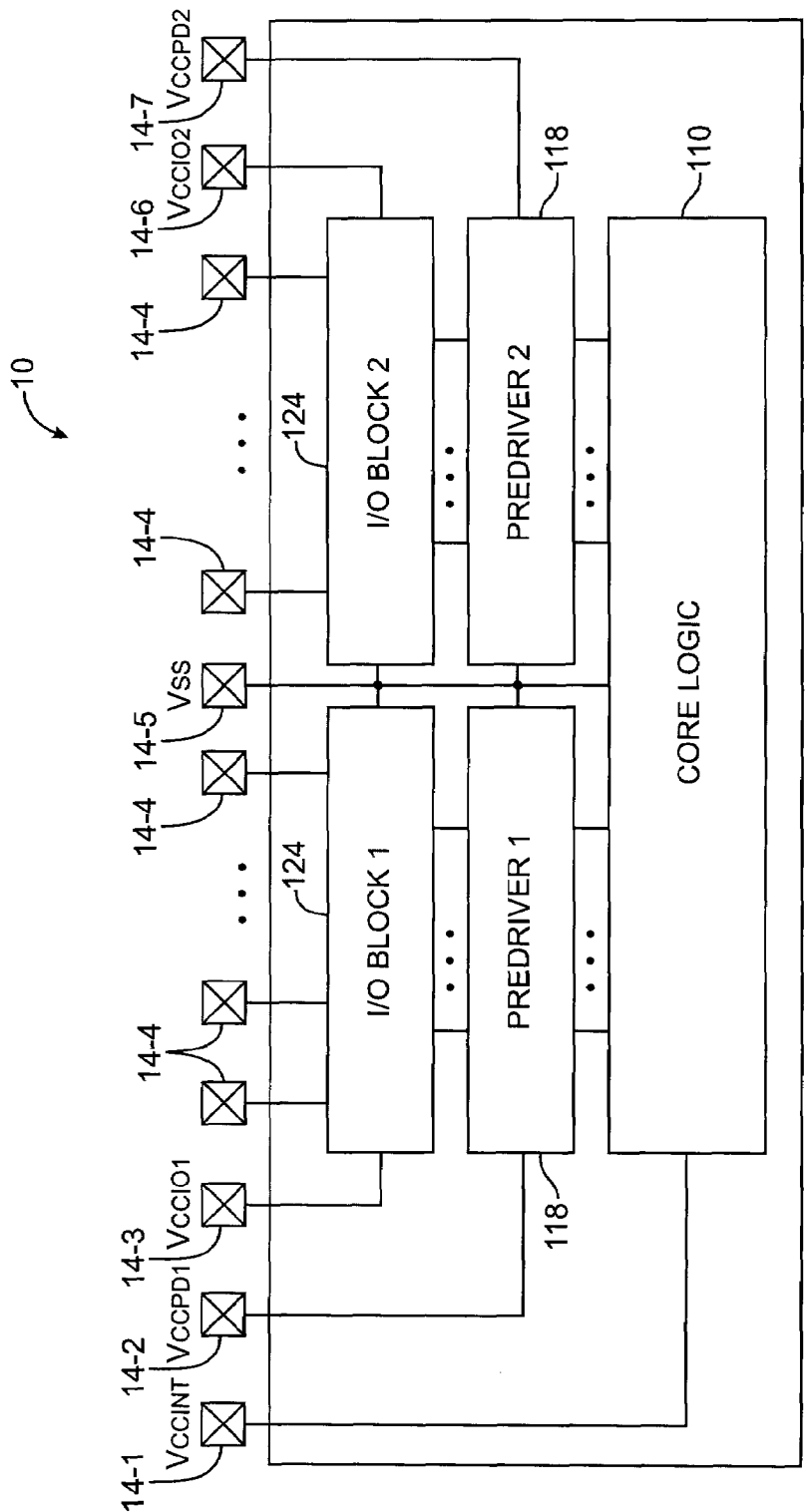
FIG. 8 is a diagram showing how multiple predriver power supply voltages may be provided to a programmable logic device integrated circuit through respective predriver power supply pins in accordance with the present invention.

Power supply voltages may be provided to circuitry such as the input-output circuit blocks and predriver circuit blocks of FIG. 7 using any suitable scheme. With the illustrative arrangement shown in FIG. 8, power supply signals are received through pins 14 and are distributed to circuitry on device 10 through corresponding power supply distribution paths. The signal Vccint is received at pin 14-1. Pin 14-2 is used to receive a first value of Vccpd called Vccpd1. The signal Vccpd1 is used to power predriver 1. Pin 14-7 is used to receive a second value of Vccpd called Vccpd2. The power supply voltage Vccpd2 is routed to predriver2. Pins 14-3 and 14-6 receive power supply signals Vccio1 and Vccio2, respectively. Vccio1 is used to power input-output block 1 and Vccio2 is used to power input-output block 2. Pins such as pin 14-5 are used to receive ground signals for the input-output blocks, predriver blocks, and core logic. If desired, separate pins and ground supply signals may be used for each block. Data signals may handled using pins 14-4.

The performance of predriver circuitry 118 of programmable logic device 10 is affected by the power supply voltages that are used. In general, reducing the magnitude of Vccpd for a given predriver circuit will tend to slow the switching speed of that predriver circuit. Reductions in predriver performance may be acceptable for some signal paths and unacceptable for other signal paths. Accordingly, the CAD tools 62 preferably take into account predriver power-supply-dependent performance variations when implementing a desired logic design.

As an example, consider a design in which there are two predrivers and two signal paths that pass through predrivers. For the design to function properly, the signal delay for the first predriver signal path must not exceed time t1. The signal delay for the second predriver signal path must not exceed time t2. Time t1 is smaller than time t2 (in this example), indicating that timing is more critical on the first predriver signal path than on the second predriver signal path. During the operation of tools 62, tools 62 determine that the t1 timing constraint will be satisfied only if the predriver through which the first predriver signal path passes is fully powered (i.e., if Vccpd for that predriver is equal to Vccio-max, the maximum permitted value of Vccio). Tools 62 also determine that the timing constraint on the second signal (i.e., the minimum switching delay of t2) can be satisfied in a predriver in which the value of Vccpd has been lowered to 2.5 volts.

Because the design constraint associated with the second predriver path is less severe than for the first predriver signal path, tools 62 are able to reduce predriver power consumption while satisfying design constraints. The tools 62 implement the desired design by assigning the first predriver signal path to a fully-powered predriver block and assign the second predriver signal path to a predriver block powered at the reduced supply level of 2.5 volts. In this example, one value of Vccpd is held high and one value of Vccpd is reduced. In other situations, all Vccpd values may be lowered. For example, if both the first and second predriver signal paths had minimum timing delays of t2, the power supply voltage Vccpd could be reduced for both predriver blocks.

As these examples demonstrate, tools 62 can automatically search for recommended values of Vccpd that will satisfy the logic designer's specified circuit design constraints. The logic designer can also manually adjust settings that influence how the tools 62 handle the predriver power consumption optimization process.

Figure 9:
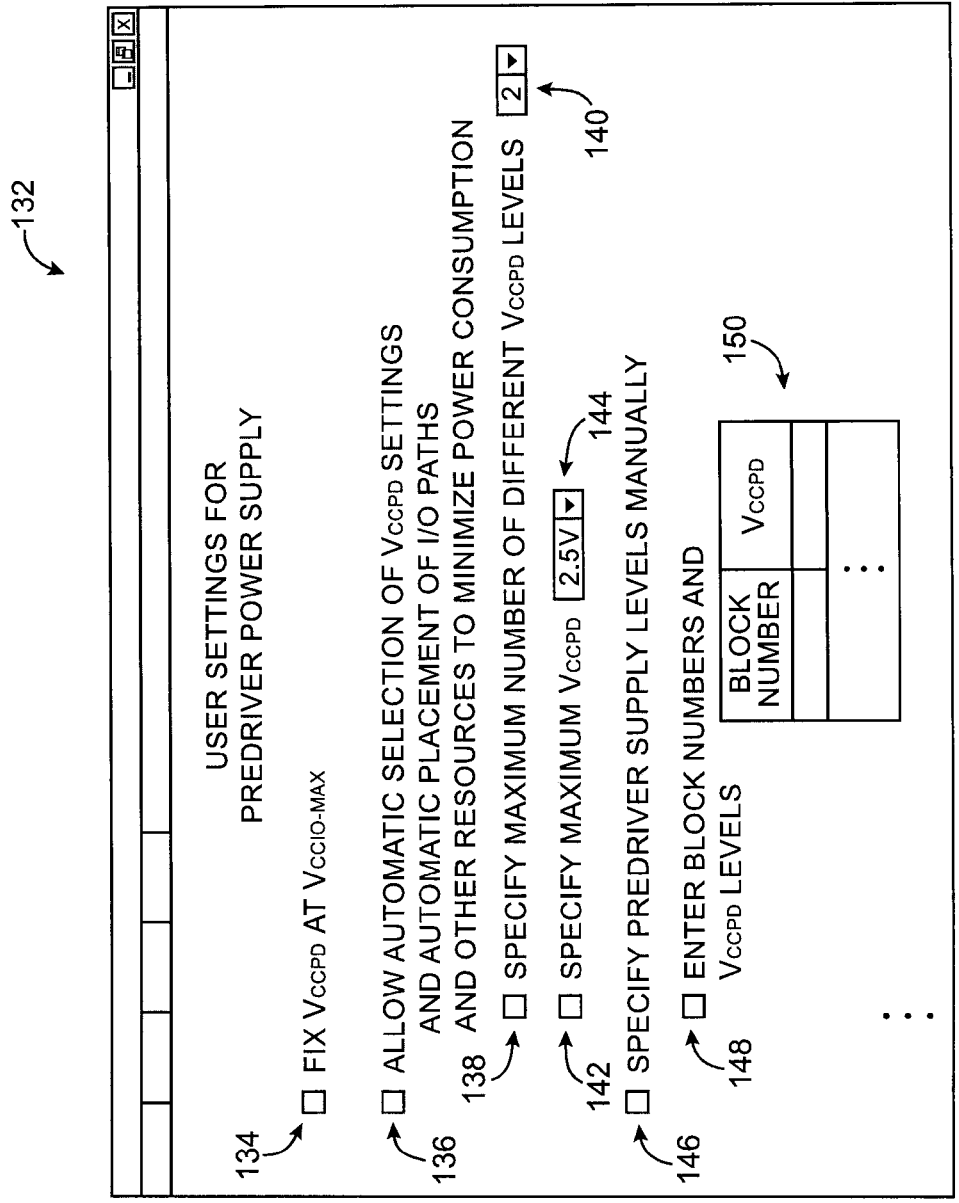
FIG. 9 is an illustrative settings screen that a logic design tool can provide to a user to allow adjustment of predriver power supply settings for the tool in accordance with the present invention.

An illustrative settings screen 132 that may be presented to a logic designer by CAD tools 62 is shown in FIG. 9. The on-screen options of screen 132 may be used to adjust settings related to minimizing predriver power consumption. The arrangement of FIG. 9 is merely illustrative. Any suitable arrangement may be used to obtain settings information from the logic designer (e.g., using tools 64 of FIG. 4). Moreover, default settings can be used in place of user-adjustable settings if desired.

In the illustrative arrangement of FIG. 9, option 134 may be used to choose whether or not to allow the CAD tools 62 to automatically attempt to minimize predriver power consumption. If option 134 is selected (by clicking on the associated box), the tools 62 will use a fixed value for Vccpd. As a result, the tools 62 will not attempt to identify improvements in predriver power consumption that may be obtained using different values of Vccpd. Vccpd will be fixed (e.g., at the maximum permitted value of Vccio for the programmable logic device being used).

Option 136 may be used to choose whether or not the CAD tools 62 will automatically identify one or more predriver power supply levels that will lower predriver power consumption while satisfying design constraints. If option 136 selected, CAD tools 62 will make permissible adjustments to the recommended predriver voltages Vccpd to reduce predriver power consumption. If option 138 is selected, the logic designer can use option 140 to specify the maximum number of different Vccpd levels to be considered by the tools 62. Option 140 may be implemented using a drop-down menu or any other suitable user interface arrangement. If, as an example, the logic designer checks box 138 and enters a "2" in option 140, the tools 62 will only produce Vccpd recommendations with two different Vccpd values (e.g., one at full power and one at a suitable reduced power). If the logic designer enters a "1" in option 140, tools 62 will generate the minimum satisfactory value for Vccpd.

If option 142 is selected, CAD tools 62 will limit the recommended values of Vccpd to the value entered by the logic designer using option 144. A similar arrangement may be used to place a limit on the minimum value to be considered for Vccpd or to provide tools 62 with a set of permissible Vccpd values.

If option 146 is selected, the logic designer can provide manual Vccpd assignments. In the example of FIG. 9, option 148 and interactive table 150 can be used to specify desired Vccpd values for a number of blocks of predriver circuitry 118 such as blocks PRE1, PRE2, . . . PRE8 in FIG. 7. If table 150 is filled in, CAD tools 62 will compute the performance of each predriver block and will use this information in generating configuration data that implements the logic designer's design in a way that satisfies the design's constraints such as timing constraints on the predriver signal paths.

Figure 10:
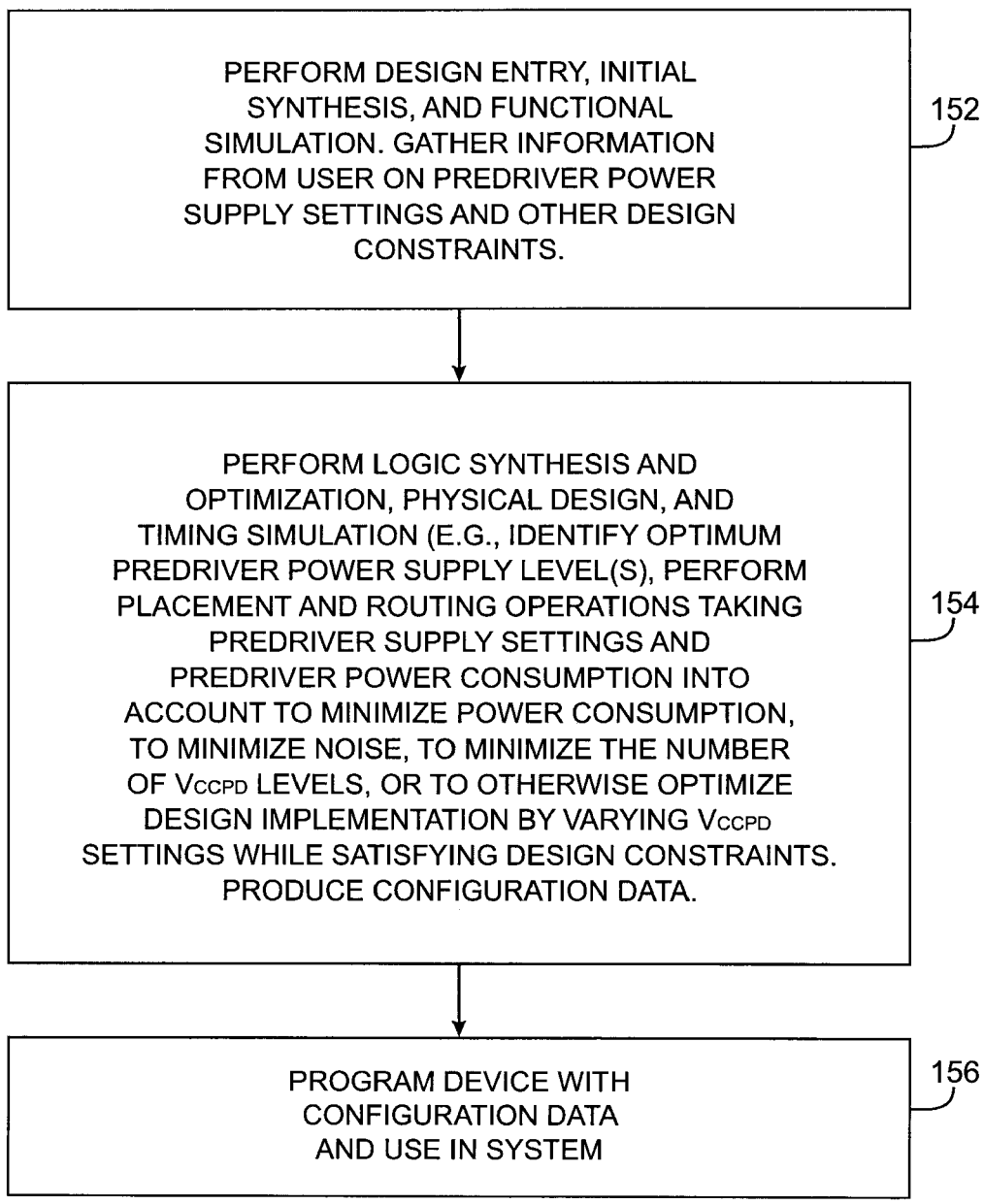
FIG. 10 is a flow chart of illustrative steps involved in using a logic design tool to minimize predriver power consumption by selecting optimum predriver power supply voltages for a circuit design in accordance with the present invention.

Illustrative steps involved in using CAD tools 62 to minimize predriver power consumption when implementing a custom logic design in a programmable logic device integrated circuit are shown in FIG. 10.

At step 152, tools such as design and constraint entry tools 64 use input screens to obtain the desired custom logic design from the logic designer. The design includes design constraints such as timing constraints, signal strength constraints, logic function constraints, etc. A settings screen such as screen 132 of FIG. 9 and/or other suitable user input arrangements (e.g., voice command input arrangements and batch processing mode input arrangements) are used to gather user settings related to identifying one or more appropriate predriver power supply levels. If desired, some or all settings may be provided as defaults.

During step 152, the user can specify constraints such as delay or speed, predriver power supply level, current drive, noise level, core voltage setting, I/O voltage setting, temperature, etc.

For example, a user may specify a desire that a particular I/O block operate at a particular minimum speed or maximum delay. This can be done on an I/O-block-by-I/O-block basis, on a group of I/O blocks, or on an entire chip.

A user may specify desired Vccpd voltage. The user can only supply either a permissible range or a particular value of Vccpd. This can be done on an I/O-block-by-I/O-block basis, on a group of I/O blocks, or on an entire chip.

A user may specify a desired current drive setting. For example, the user may specify that each I/O circuit should supply a defined current level. This can be done on an I/O-block-by-I/O-block basis, on a group of I/O blocks, or on an entire chip.

A user may specify a desired noise level. Generally higher Vccpd values result in higher noise. Using tool(s) 62, a user can specify a noise tolerance level, an acceptable range of levels, etc. The design tools will ensure that the noise constraint is not exceeded when implementing the design. This can be done on an I/O-block-by-I/O-block basis, on a group of I/O blocks, or on an entire chip.

A user may specify a desired core voltage setting. If desired, there can be more than one core voltage setting. Some parts may have higher core voltages and run faster whereas other parts may have lower core voltages and run slower. This can be done on an I/O-block-by-I/O-block basis, on a group of I/O blocks, or on an entire chip.

A user may specify a desired I/O voltage setting. This can be done on an I/O block-by-I/O block basis, on a group of I/O blocks, or on the whole chip.

A user may specify a desired operating temperature setting. The operating temperature may be specified for a particular chip or for a system.

If desired, settings such as these may be provided as defaults (e.g., when a user does not specify any such constraints).

At step 154, logic synthesis and optimization, physical design, and timing simulation operations may be performed using tools 72, 74, 76, and 78. During these operations, the CAD tools 62 process the design constraints and predriver power supply level settings obtained at step 152 and produce a design implementation for the programmable logic device integrated circuit. In particular, based on the user-supplied predriver power supply settings gathered using screen 132 of FIG. 9, the CAD tools identify predriver power supply levels (Vccpd values) to be used in powering the device when the device is used in a system of the type described in connection with FIG. 2.

The CAD tools may identify any suitable number of predriver power supply voltages (e.g., one predriver power supply voltage, two different predriver power supply voltages, three different predriver power supply voltages, etc.). The predriver power supply levels can be less than or equal to the maximum value Vccio-max of the input-output power supply voltage that is permitted for the programmable logic device integrated circuit. For example, if the maximum input-output power supply voltage Vccio-max is 3.3 volts, the CAD tools may identify suitable Vccpd values such as 1.5 volts, 1.8 volts, 2.5 volts, or any other suitable power supply voltage (typically greater than Vccint and less than or equal to Vccio-max).

The CAD tools allocate resources and perform placement operations that ensure that the implementation of the desired custom logic circuit satisfies design constraints. The CAD tools produce corresponding configuration data for programming the programmable logic device. Device resources are allocated so that components that are most able to handle predriver performance degradations associated with lowered predriver power supply levels are powered using the lowered predriver supplies. Components that require higher levels of performance are powered with larger predriver supplies. This allows CAD tools 62 to minimize predriver power consumption without violating design constraints.

During step 154, the CAD tools balance performance criteria against power consumption criteria. In resolving conflicts between various design constraints, the tools 62 can make tradeoffs (e.g., performance versus power consumption). Tradeoffs can be made based on criteria provided by the logic designer and can be made based on predefined criteria (e.g., criteria built into tools 62).

The operations of step 154 are performed in accordance with the user predriver power supply settings gathered using screen 132 of FIG. 9 (or other suitable user input interface). If the user selected box 134, the CAD tools 62 fix the predriver power supply voltage at Vccio-max. In this situation, the CAD tools 62 will not attempt to automatically identify Vccpd levels that differ from Vccio-max and will not gather manually-supplied values for Vccpd that differ from Vccio-max. The value of Vccpd will be assumed to be Vccio-max for all performance simulations. If box 136 is selected, CAD tool(s) 62 will attempt to automatically identify one or more Vccpd levels that differ from Vccio-max during step 154. If option 138 is selected, the CAD tool(s) will use the user-supplied setting in box 140 as the upper limit on the number of permissible Vccpd levels. If option 142 is selected, the CAD tool(s) will implement the desired design using the Vccpd maximum limit specified in box 144. If option 146 is selected and the user has used option 148 and table 150 to supply Vccpd levels for each of the blocks of predriver circuitry, these block-based predriver power supply levels will be used during the operations of step 154.

During step 154, the CAD tool(s) 62 take the constraints from step 152 into account and attempt to produce an optimal solution that satisfies the constraints and optimizes power consumption. The ability to vary Vccpd both within a given chip and between chips in a system allows the CAD tools to optimize power consumption, to minimize noise, to minimize the number of Vccpd levels that are used, etc. In many designs, reduced power consumption is of primary importance, but, if desired, other design factors can be given greater weight. The optimal solution produced by the CAD tools includes a predriver power supply level setting for each I/O circuit block, a group of I/O blocks, or an entire chip. The CAD tool(s) 62 can decide which I/O circuit blocks are used to handle each signal on the chip. So, for example, the tool can determine that all I/O circuits using one predriver power supply value will be grouped together in a certain location on a chip.

Consider, as an example, the situation in which a user specifies that a design to be implemented in a programmable logic device integrated circuit should satisfy the following constraints: speed equals 100 MHz, current drive equals 12 mA, noise level equals 100 mv, core voltage equals 1.1V, Vccio equals 3.3V, and operating temperature equals 85C. The CAD tool(s) 62 determines a value of Vccpd that satisfies these constraint's. If desired, each constraint value may have a corresponding default value that is used whenever the user does not supply a value. In addition, the user can specify when the user does not desire to constrain one or more of the settings. This provides the CAD tool(s) 62 with one or more additional degrees of freedom in determining appropriate settings values.

The user can specify a range of values for one or more constraints (e.g., specifying that Vccio=3.0V-3.3V and temperature=65-85C) or can choose discrete values (e.g., Vccio=3.3V or 3.0V). The user can also select a range of Vccpd values that are continuously variable (e.g. 1.5 to 3.0V) or he can choose discrete values (e.g. 1.5V, 2.0V, 2.5V, 3.0V). Following optimization, tool(s) 62 provides a recommended predriver power supply value or values to the user. For example, the tool(s) can inform the user that a Vccpd value of 3.0 volt is to be used to power one block of I/Os, whereas a Vccpd value of 2.5 volts or 3.0 volts is to be used to power another set of I/Os.

In practice, many programmable logic device integrated circuits have independent ground voltages (i.e., Vssint for use in conjunction with Vccint, Vssio for use in conjunction with Vccio, and Vsspd for use in conjunction with Vccpd. In general, a desired power supply voltage level may be produced (1) by raising the positive power supply rail, (2) by lowering the ground rail, or (3) by both raising the positive power supply rail and lowering the ground rail. As an example, the predriver power supply voltage may be raised (1) by increasing Vccpd while maintaining Vsspd constant (e.g., at 0 volts), (2) by lowering Vsspd (e.g., while maintaining Vccpd fixed at 1.8 volts), or by both raising Vccpd and lowering Vsspd. As defined herein, the terms "predriver power supply voltage" and "predriver power supply level" refer to power supply values that are established using any of these three techniques. Similarly, the core power supply voltage and I/O power supply voltage levels may be established using any of these approaches.

After the desired logic design has been satisfactorily optimized at step 154, the tools 64 of the logic design system 56 can produce configuration data for programming the programmable logic device. The programmable logic device can be provided with the configuration data and used in a system of the type described in FIG. 2 at step 156. The configuration data configures the programmable logic device to perform the desired custom logic function of the logic designer. Because tools 62 were used in producing the implementation of the desired design, the configuration data will configure the logic device in a way that uses resources and routes signals so that the design constraints are satisfied and predriver power consumption is minimized, provided that the system in which the programmable logic device is used provides power supply levels to the predrivers in accordance with the recommendations of tools 62.

Figure 11:
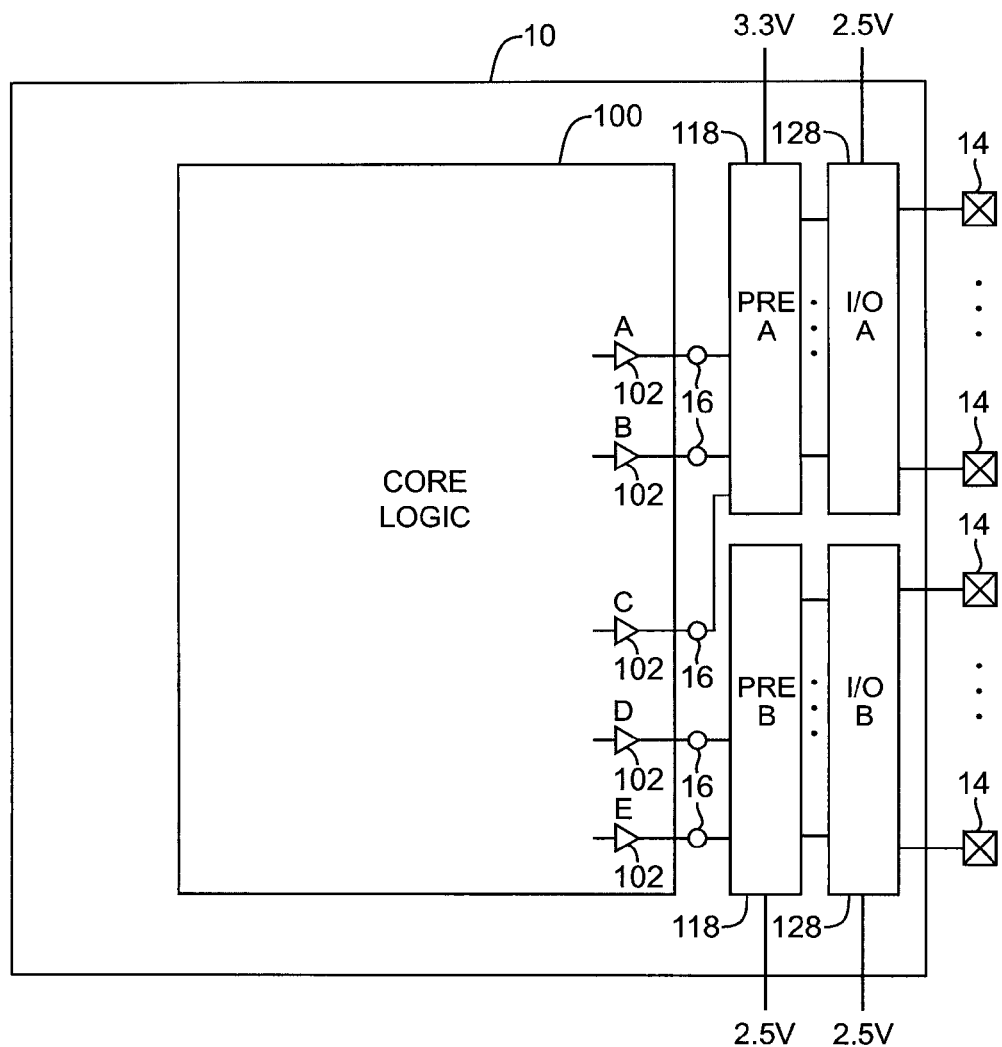
FIG. 11 is a diagram showing how resources and interconnect pathways can be assigned to allow predriver power consumption to be minimized in a programmable logic device integrated circuit while satisfying design constraints in accordance with the present invention.

A programmable logic device 10 of the type that may be configured using CAD tools 62 is shown in FIG. 11. The example of FIG. 11 illustrates how CAD tools 62 allocate resources and make placement decisions to optimize predriver power consumption while satisfying design constraints. In the example of FIG. 11, core logic 100 has 5 output drivers 102 (labeled A, B, C, D, and E). There are two blocks of predriver circuitry 118 (labeled PRE A and PRE B) and two corresponding input-output circuits 128 (labeled I/O A and I/O B). Signals from core logic 110 pass to predriver circuits 118 via programmable interconnects 16. The pattern of programmable interconnects 16 is dictated by the configuration data loaded into programmable elements 20 (FIG. 1). Output signals from core logic 110 are strengthened by predriver circuitry 118 and corresponding strengthened versions of the core logic output signals are provided to input-output pins 14 by input-output circuitry 128.

Based on user settings and/or automatic analysis, the CAD tools 62 determine that blocks I/O A and I/O B are to be powered using Vccio values of 2.5 volts. Predriver PRE A is to be powered using a 3.3 volt supply (i.e., a supply equal to Vccio-max). Predriver PRE B is to be powered using a reduced power supply level of 2.5 volts, thereby reducing predriver power consumption.

CAD tools 62 allocate resources and make placement and routing decisions that ensure that the logic designer's design constraints are satisfied. In the example of FIG. 11, three of the five core logic data signals being produced are fast signals that have more stringent timing constraints than the other two, which are slow signals. The circuitry of block PRE A operates with less delay than the circuitry of block PRE B, because PRE A is powered at 3.3 volts, whereas PRE B is powered at 2.5 volts. CAD tools 62 ensures that the timing constraints and other design constraints are satisfied, by allocating two drivers A and B that are adjacent to predriver block A to handle two of the three fast signals. Associated programmable interconnects 16 route the outputs of drivers A and B to the PRE A predriver circuitry. The third fast signal is handled by driver C. Driver C is not adjacent to the PRE A predriver, but interconnect resources 16 are programmed to route the fast signal output of driver C to the PRE A predriver. The slow signals are handled by drivers D and E, which are placed adjacent to the PRE B predriver circuitry 118. As this example demonstrates, CAD tools 62 make appropriate resource and interconnect assignments to ensure that the three fast signals are handled by the fast predriver block (PRE A), whereas the two slow signals are handled by the slow predriver block (PRE B).

In situations in which the CAD tools 62 generate recommendations for the Vccpd values to be used in powering a programmable logic device in a system, the CAD tools 62 can generate one or more recommendations screens on may use other suitable output formats to present a user with predriver power supply voltage recommendations. An illustrative predriver voltage recommendations screen 158 is shown in FIG. 12. In the example of FIG. 12, CAD tools 62 present recommendations for predriver voltages Vccpd on a block-by-block basis using table 160. Predriver block numbers are listed in the first column of table 160. Corresponding recommended Vccpd values are listed in the second column of table 160. The CAD tools 62 produce configuration data that configures a programmable logic device for operation with the Vccpd values of table 160. The programmed logic device is installed and operated in a system (e.g., on a board 36 of the type shown in FIG. 2). The board supplies predriver power supply voltages Vccpd to the appropriate predriver power supply pins on the programmable logic device, so that the blocks of predriver circuitry are powered appropriately.

Through the use of CAD tools 62, logic designers can produce optimum design implementations for their desired programmable logic device circuits based on user-supplied and default constraints. In these designs, different predriver voltages Vccpd may be used as needed to optimize the design for attributes such as noise level, power consumption, number of Vccpd voltages used, etc. Because Vccpd may vary, it is not necessary to make the design compromises required using conventional arrangements. A single type of programmable logic device integrated circuit can be used in different ways with different Vccpd levels, depending on the logic designer's needs.

Figure 13:
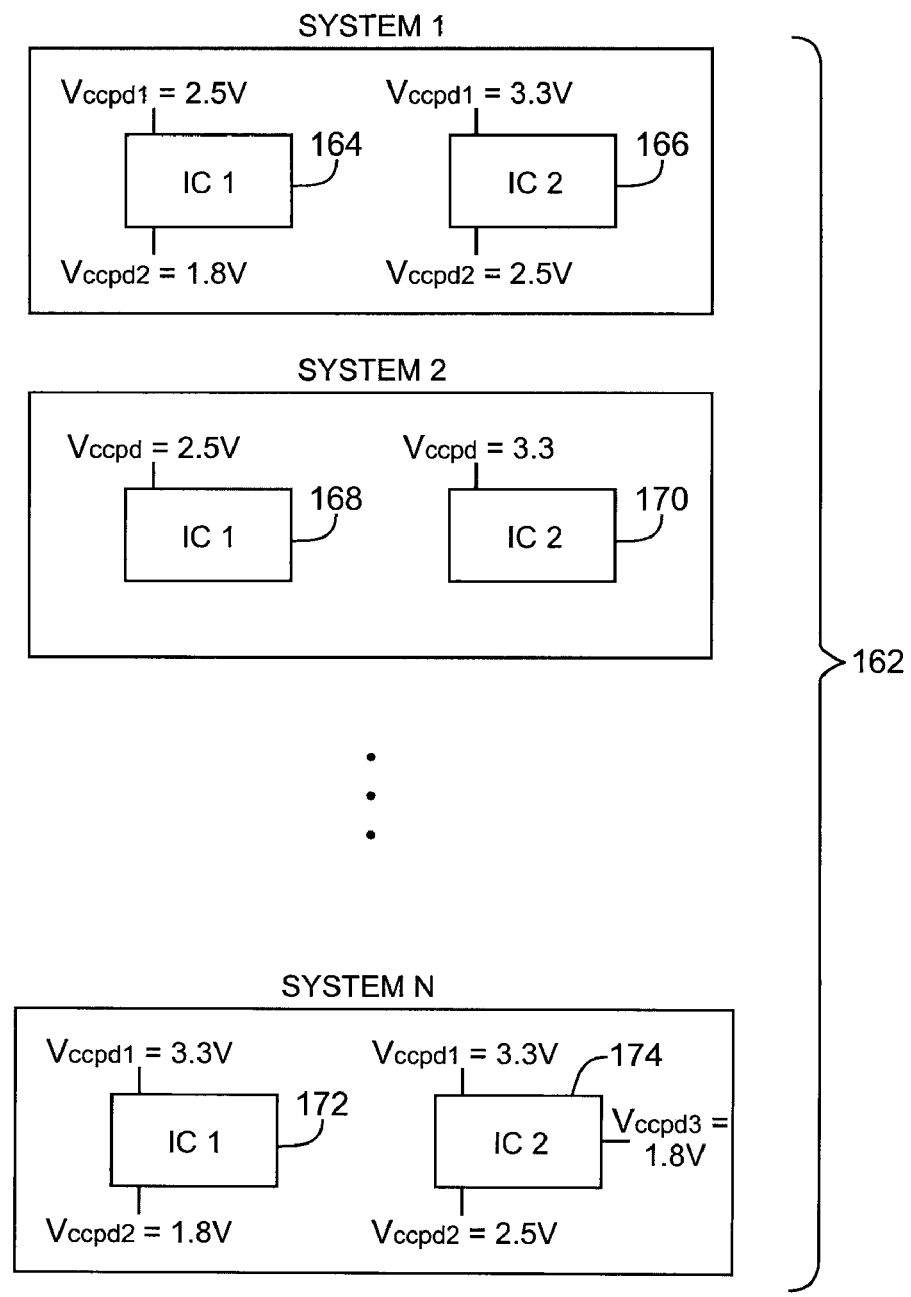
FIG. 13 is a diagram showing the use of different predriver power supply levels on different integrated circuits in accordance with the present invention.

FIG. 13 shows how a single programmable logic device integrated circuit (i.e., a single type of programmable logic device integrated circuit, as specified by its model number, product family, or other suitable identifier) may be powered using different Vccpd values in different systems 162 and/or within a single chip. The integrated circuit chips in systems 162 are all of the same type.

In system 1, integrated circuit 164 is powered using Vccpd values of 2.5 volts and 1.8 volts. These different Vccpd values may be used for different blocks of circuitry on integrated circuit 164. These values are relatively low, because the design for integrated circuit 164 was optimized for power consumption and reduced noise. Integrated circuit 166, which is also located in system 1 may be powered using Vccpd values of 3.3 volts and 2.5 volts. These values are higher, because the design for integrated circuit 166 was optimized for speed and used a more generous power consumption budget.

In system 2, integrated circuit 168 is powered using a Vccpd value of 2.5 volts. Integrated circuit Vccpd is powered using a Vccpd value of 3.3 volts. Only one Vccpd value is used for each integrated circuit in system 2, because the logic designer has chosen to minimize the total number of Vccpd values used.

A different set of illustrative Vccpd values is used in system N. A logic designer may choose to use the illustrative Vccpd values shown in systems 162 to reduce noise, to minimize power consumption, to satisfy a constraint based on a desired maximum number of Vccpd levels, or to otherwise optimize the designer's logic design. Because Vccpd can vary within blocks on a given integrated circuit chip and can vary between integrated circuit chips of the same type, the present invention provides more flexibility to satisfy design goals than conventional arrangements.

The foregoing is merely illustrative of the principles of this invention and various modifications can be made by those skilled in the art without departing from the scope and spirit of the invention.

What is claimed is:

1. Software on a computer-readable storage media to be executed by a computer, the software comprising:

code for identifying a programmable logic device predriver power supply level for a programmable logic device integrated circuit that is different from a maximum permitted input-output power supply voltage for the programmable logic device integrated circuit and that is used to power predriver circuitry on the programmable logic device integrated circuit through a predriver power supply pin separate from input-output power supply pins used to power input-output circuitry on the programmable logic device integrated circuit.

2. The software defined in claim 1 further comprising code for displaying a screen that contains user-selectable computer-aided design tool settings associated with minimizing power consumption by the predriver circuitry on the programmable logic device integrated circuit.

3. A computer-implemented method for using a computer-aided design tool to minimize predriver power consumption when implementing a custom circuit design in a programmable logic device integrated circuit, wherein the programmable logic device integrated circuit has core logic that is powered using a core logic power supply voltage received through at least one core logic power supply pin, input-output circuitry that is powered using at least one input-output circuitry power supply voltage that is received through at least one input-output circuitry power supply pin and that is less than or equal in magnitude to a maximum permitted input-output power supply voltage for the programmable logic device integrated circuit, and predriver circuitry that is powered using at least one predriver power supply voltage that is received through at least one predriver power supply voltage pin, and wherein the predriver circuitry is connected between the core logic and the input-output circuitry and receives signals from the core logic and provides corresponding strengthened signals to the input-output circuitry, the computer-implemented method comprising:

using the computer-aided design tool to identify a predriver power supply level for powering the predriver circuitry on the programmable logic device integrated circuit through the predriver power supply pin that is different from the maximum permitted input-output power supply voltage for the programmable logic device integrated circuit.

4. The computer-implemented method defined in claim 3 further comprising using the computer-aided design tool to display a screen that contains selectable user settings associated with minimizing power consumption by the predriver circuitry.

5. The computer-implemented method defined in claim 3 further comprising using the computer-aided design tool to display a screen that contains selectable user settings associated with minimizing power consumption by the predriver circuitry, wherein using the computer-aided design tool to display the screen comprises using the computer-aided design tool to display a user-selectable on-screen option to allow automatic selection of predriver power supply settings by the computer-aided design tool.

6. The computer-implemented method defined in claim 3 further comprising using the computer-aided design tool to display a screen that contains selectable user settings associated with minimizing power consumption by the predriver circuitry, wherein using the computer-aided design tool to display the screen comprises using the computer-aided design tool to display a user-selectable on-screen option to direct the computer-aided design tool to accept manual selection of predriver power supply settings.

7. The computer-implemented method defined in claim 3 further comprising using the computer-aided design tool to display a screen that contains selectable user settings associated with minimizing power consumption by the predriver circuitry, wherein using the computer-aided design tool to display the screen comprises using the computer-aided design tool to display a user-selectable on-screen option that allows a user to specify a maximum number of different predriver power supply levels for the computer-aided design tool to use in implementing the custom circuit design in the programmable logic device integrated circuit.

8. The computer-implemented method defined in claim 3 further comprising using the computer-aided design tool to display a screen that contains selectable user settings associated with minimizing power consumption by the predriver circuitry, wherein using the computer-aided design tool to display the screen comprises using the computer-aided design tool to display a user-selectable on-screen option to allow a user to supply a user-specified maximum voltage for the predriver power supply level for the computer-aided design tool to use as a constraint in implementing the custom circuit design in the programmable logic device integrated circuit.

9. The computer-implemented method defined in claim 3 further comprising using the computer-aided design tool to display a screen that contains selectable user settings associated with minimizing power consumption by the predriver circuitry, wherein using the computer-aided design tool to display the screen comprises using the computer-aided design tool to display a user-selectable on-screen option to allow a user to supply a user-specified maximum voltage for the predriver power supply level for the computer-aided design tool to use as a constraint in implementing the custom circuit design in the programmable logic device integrated circuit, wherein the user-specified maximum voltage is less than the maximum permitted input-output power supply voltage for the programmable logic device integrated circuit.

10. The computer-implemented method defined in claim 3 further comprising using the computer-aided design tool to display a screen that contains selectable user settings associated with minimizing power consumption by the predriver circuitry, wherein using the computer-aided design tool to display the screen comprises using the computer-aided design tool to display a user-selectable on-screen option to allow a user to supply a plurality of user-specified predriver power supply voltages for the computer-aided design tool to use in implementing the custom circuit design in the programmable logic device integrated circuit.

11. The computer-implemented method defined in claim 3 further comprising using the computer-aided design tool to display a screen that contains selectable user settings associated with minimizing power consumption by the predriver circuitry, wherein using the computer-aided design tool to display the screen comprises using the computer-aided design tool to display user-selectable on-screen options that allow a user to identify a plurality of blocks of predriver circuitry and that allow the user to supply a plurality of corresponding user-specified predriver power supply voltages for the plurality of blocks for the computer-aided design tool to use in implementing the custom circuit design in the programmable logic device integrated circuit.

12. The computer-implemented method defined in claim 3 further comprising:

using the computer-aided design tool to perform placement operations to determine where to locate predriver signal paths within the programmable logic device integrated circuit to implement the custom circuit design while satisfying design constraints for the custom circuit design and minimizing predriver power consumption.

13. The computer-implemented method defined in claim 3 further comprising using the computer-aided design tool to generate configuration data that programs the programmable logic device integrated circuit to implement the custom circuit design when the configuration data is loaded into the programmable logic device integrated circuit.

14. A computer-implemented method for using a computer-aided design tool when implementing a custom circuit design in a programmable logic device integrated circuit, wherein the programmable logic device integrated circuit has core logic that is powered using a core logic power supply voltage received through at least one core logic power supply pin, input-output circuitry that is powered using at least one input-output circuitry power supply voltage that is received through at least one input-output circuitry power supply pin and that is less than or equal in magnitude to a maximum permitted input-output power supply voltage for the programmable logic device integrated circuit, and a plurality of blocks of predriver circuitry that are powered using a plurality of corresponding predriver power supply voltages that are received through a plurality of corresponding predriver power supply voltage pins, and wherein the plurality of blocks of predriver circuitry are each connected between the core logic and the input-output circuitry and each receive signals from the core logic and provide corresponding strengthened signals to the input-output circuitry, the computer-implemented method comprising:

using the computer-aided design tool to identify a plurality of different predriver power supply levels for powering the plurality of blocks of predriver circuitry on the programmable logic device integrated circuit.

15. The computer-implemented method defined in claim 14 further comprising using the computer-aided design tool to display a screen that contains selectable user settings associated with minimizing power consumption in the predriver circuitry.

16. The computer-implemented method defined in claim 14 further comprising using the computer-aided design tool to display a user-selectable on-screen option to allow automatic selection of predriver power supply settings by the computer-aided design tool.

17. The computer-implemented method defined in claim 14 further comprising using the computer-aided design tool to display a user-selectable on-screen option to direct the computer-aided design tool to accept manual selection of individual predriver power supply voltage settings for each of the plurality of blocks of predriver circuitry.

18. The computer-implemented method defined in claim 14 further comprising using the computer-aided design tool to display a user-selectable on-screen option that allows a user to specify a maximum number of different predriver power supply levels for the computer-aided design tool to use in implementing the custom circuit design in the programmable logic device integrated circuit.

19. The computer-implemented method defined in claim 14 further comprising using the computer-aided design tool to display a user-selectable on-screen option to allow a user to supply a user-specified maximum voltage for the predriver power supply level for the computer-aided design tool to use as a constraint in implementing the custom circuit design in the programmable logic device integrated circuit.

20. A method for using a plurality of programmable logic device integrated circuits of a single type, wherein each of the plurality of programmable logic device integrated circuits has core logic that is powered using a core logic power supply voltage, input-output circuitry that is powered using an input-output circuitry power supply voltage that is received through an input-output power supply pin on the programmable logic device integrated circuit, and predriver circuitry that is powered using a predriver power supply voltage that is received through a predriver power supply pin on the programmable logic device integrated circuit that is separate from the input-output power supply pin and wherein the predriver circuitry is connected between the core logic and the input-output circuitry on each programmable logic device integrated circuit and receives signals from the core logic and provides corresponding strengthened signals to the input-output circuitry, the method comprising:

powering each of the programmable logic device integrated circuits of the single type using a different predriver power supply level, wherein powering the programmable logic device integrated circuits of the single type comprises powering each programmable logic device integrated circuit with power for its input-output circuitry through its input-output power supply pin and wherein powering the programmable logic device integrated circuits of the single type comprises powering each programmable logic device integrated circuit with power for its predriver circuitry through its predriver power supply pin.

* * * * *